(12) United States Patent
Soemers et al.

(10) Patent No.: US 7,604,359 B2
(45) Date of Patent: Oct. 20, 2009

(54) HIGH POSITIONING REPRODUCIBLE LOW TORQUE MIRROR-ACTUATOR INTERFACE

(75) Inventors: Herman Soemers, Mierlo (NL); Franciskus Hendrikus van Deuren, Valkenswaard (NL); Hendrik Dirk Visser, Eindhoven (NL); Sander C. Broers, Eindhoven (NL)

(73) Assignee: Carl Zeiss SMT AG, Oberkochen (DE)

( * ) Notice: Subject to any disclaimer, the term of this patent is extended or adjusted under 35 U.S.C. 154(b) by 357 days.

(21) Appl. No.: 11/115,984

(22) Filed: Apr. 27, 2005

(65) Prior Publication Data

US 2005/0248860 A1 Nov. 10, 2005

Related U.S. Application Data

(60) Provisional application No. 60/568,586, filed on May 4, 2004.

(51) Int. Cl.
*G02B 7/182* (2006.01)
(52) U.S. Cl. ........................................ 359/872
(58) Field of Classification Search ............... 359/872
See application file for complete search history.

(56) References Cited

U.S. PATENT DOCUMENTS 5,862,003 A * 1/1999 Saif et al. .............. 359/871

2003/0010902 A1 1/2003 Hof et al.
2003/0058422 A1 3/2003 Loopstra et al.

FOREIGN PATENT DOCUMENTS

WO WO-98/13714 4/1998

OTHER PUBLICATIONS

U.S. Appl. No. 10/704,534, Koomeef et al., related application.

* cited by examiner

*Primary Examiner*—Joshua L Pritchett
(74) *Attorney, Agent, or Firm*—Darby & Darby P.C.

(57) ABSTRACT

The present high positioning reproducible mirror-actuator interface disclosed herein overcomes the deficiencies associated with conventional interface systems and offer a number of advantages that are disclosed herein. Generally, the mirror mounts provide a reliable and robust interface between the mirrors and actuators, that serve to move and position the mirrors, as wells as providing an interface between the mirrors and gravity compensator pins. The mirror mount is characterized as having a body that has an outer peripheral wall that includes a plurality of flexible elements around the perimeter of the body, each having a high stiffness in plane and a high flexibility out of plane. The body is open at the first end to allow flexing of the flexible elements. The flexible elements providing a direct coupling interface between the mirror mount and the mirror. The flexible elements of the mirror mount provides a number of advantages and increases the performance capabilities of the first mechanical interface between the mirror mount and the actuator.

17 Claims, 7 Drawing Sheets

HIGH POSITIONING REPRODUCIBLE LOW TORQUE MIRROR-ACTUATOR INTERFACE

CROSS-REFERENCE TO RELATED APPLICATION

The present application claims the benefit of U.S. patent application Ser. No. 60/568,586, filed May 4, 2004, which is hereby incorporated by reference in its entirety.

TECHNICAL FIELD

The present invention relates to projection lithography and more particularly, to mechanical constructions for optic elements, such as a lens of a refractive system or a mirror arrangement, that permit precision movement of the optic elements.

BACKGROUND

In the manufacture of semiconductor devices, photolithography is often used. Projection optics are used to image a mask or reticle onto a wafer. Optical systems having a refractive group have achieved satisfactory resolutions operating with illumination sources having wavelengths of 248 or 193 nanometers. As the element or feature size of semiconductor devices becomes smaller, the need for optical projection systems capable of providing enhanced resolution are needed. In order to decrease the feature size which the optical projection systems used in photolithography can resolve, shorter wavelengths of electromagnetic radiation must be used to project the image of a reticle or mask onto a photosensitive substrate, such as a semiconductor wafer.

Because very few refractive optical materials are able to transmit significant electromagnetic radiation below a wavelength of 193 nanometers, it is necessary to reduce to a minimum or eliminate refractive elements in optical projection systems operating at wavelengths below 193 nanometers. However, the desire to resolve ever smaller features makes necessary optical projection systems that operate at the extreme ultraviolet wavelengths, below 200 nm; and therefore, as optical lithography extends into shorter wavelengths (e.g., vacuum ultraviolet (VUV)), the requirements of the projection system become more difficult to satisfy.

It has long been realized that catadioptric or catoptric optical systems have several advantages, especially in a step and scan configuration, and that catadioptric or catoptric systems are particularly well-suited to satisfy the aforementioned objectives. A number of parties have developed or proposed development of systems for wavelengths below 365 nm.

In a typical arrangement, a projection optics box (POB) contains the optical components that are used to reduce the image and form it on the photosensitive substrate (wafer). In most projection optical systems, mirrors that are carefully crafted to perform the intended functions are used in combination with a number of lenses arranged relative thereto. The mirrors serve to redirect the light in the projection optic box as it passes therethrough from the mask to the photosensitive substrate. Typically, the POB includes an arrangement of mirrors and/or lenses that are constructed and positioned to accomplish the intended result. U.S. patent application publication No. 2003/0058422 discloses a lithographic projection apparatus includes a projection system having a plurality of optical elements or sensors mounted on a frame and U.S. patent application publication No. 2003/0010902 discloses an optical system, in particular an exposure lens for semiconductor lithography, with a plurality of optical elements has at least one load-dissipating structure. The load-dissipating structure diverts the forces originating from the optical elements. The optical system also has a measuring structure constructed independently of the at least one load-dissipating structure.

Exemplary components and interfaces for positioning of mirrors in catadioptric systems have been the subject of a number of patent applications filed by the present assignee and include U.S. patent application Ser. No. 10/704,534, which is directed to hermetically sealed elements of an actuator.

Conventional mirror mounts that have been used as interface members between the mirror(s) and actuators, which serve to move and position the mirrors, suffer from a number of deficiencies. For example, the mirror mounts do not strike the proper balance between offering a stiff connection while providing a decoupling of forces (e.g., radial forces) and moments. In other words, the conventional mirror mounts fail to minimize the forces that are transferred to the mirror. This leads to the mirror mounts deforming of the mirror during normal operations as well as other performance difficulties.

What has heretofore not been available is a mirror mount that is robust and reliable, while also at the same time minimizes the forces that are transferred to the mirror.

SUMMARY

The present high positioning reproducible mirror-actuator interface disclosed herein overcomes the deficiencies associated with conventional interface systems and offer a number of advantages that are disclosed herein. In one embodiment, the interface is in the form of a mirror mount provides a stiff interface between the mirror and actuators in the desired degrees of freedom, that serve to move and position the mirror, as well as providing an interface between the mirror and actuators or static force supports. In one embodiment, the mirror mount is characterized as having a body that has an outer peripheral wall that includes a plurality of flexible elements around the perimeter of the body. Each flexible element has a high stiffness in plane and a high flexibility out of plane with the body being open at a first end to allow the flexing of the flexible elements. The flexible elements of the mirror mount provide a number of advantages and increases the performance capabilities of the mechanical interface between the mirror mount and the actuator.

In one exemplary embodiment, the mirror mount is formed as a single part, while in another embodiment, the mirror mount is defined by an outer bush that has the flexible elements formed as a part thereof; an inner bush having a body for coupling to the actuator; and a plurality of bearing pins coupled to the inner bush within an interior cavity thereof for interfacing with an actuator or static force supports. The present mirror mounts have features formed as part thereof to provide an improved interface with conventional optical equipment, such as mechanical interfaces to actuators and/or gravity compensation devices, etc.

Other features and advantages of the present invention will be apparent from the following detailed description when read in conjunction with the accompanying drawings.

BRIEF DESCRIPTION OF THE DRAWING FIGURES

The foregoing and other features of the present invention will be more readily apparent from the following detailed description and drawings figures of illustrative embodiments of the invention in which.

DETAILED DESCRIPTION OF PREFERRED EMBODIMENTS

Figure 1:
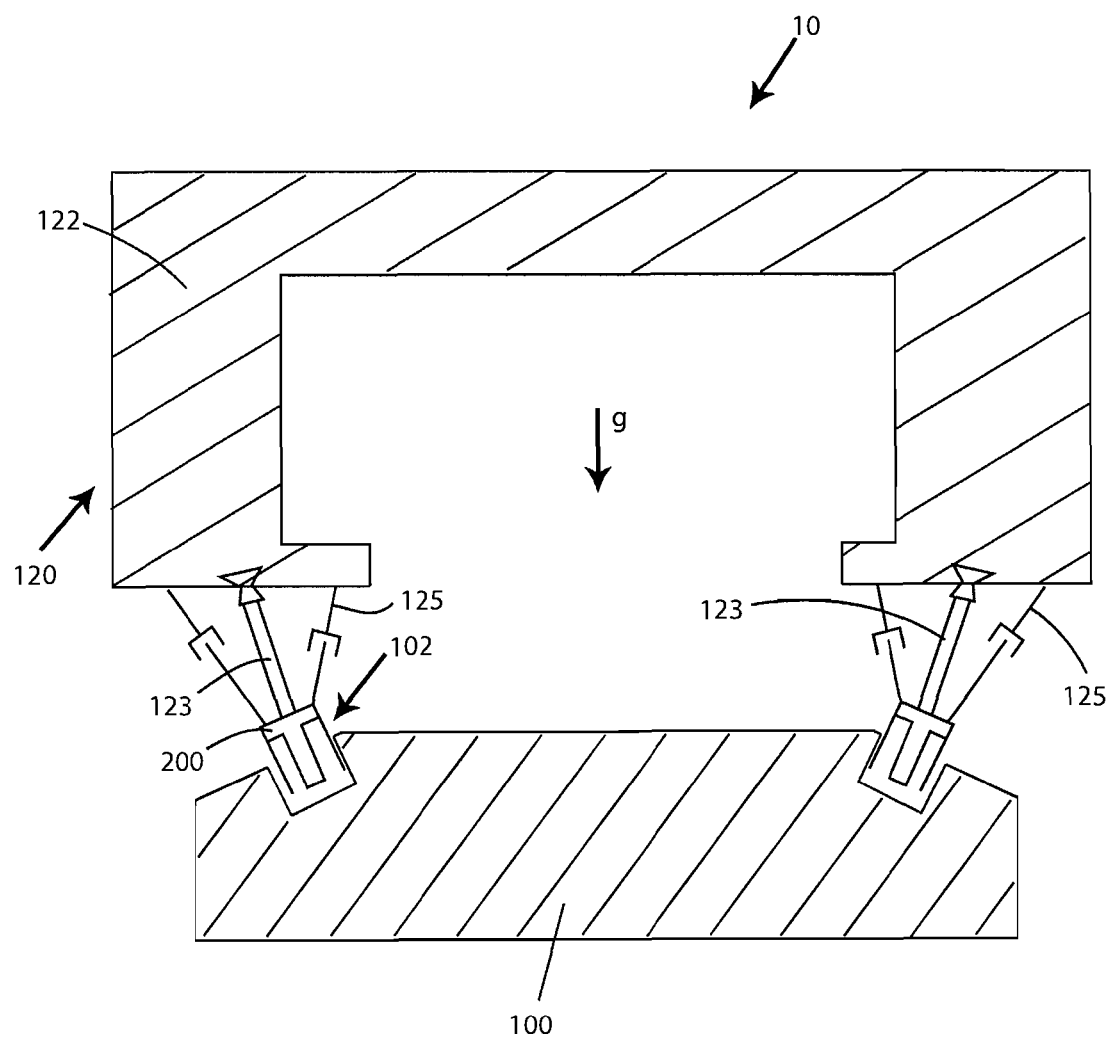
FIG. 1 is a cross-sectional view of an exemplary mirror module with an exemplary hanging actuator unit including a mirror mount being disposed at interface points thereof and the frame of the mirror module is left out.

As generally shown in FIG. 1, a mirror module 10 (excluding a frame thereof) for use in a projection optic box is illustrated and is configured to act as a conventional projection optic box for use in projection lithographic system in that once the image is reflected from a mask, the light travels through a projection optic system that is contained within the projection optic box. The projection optic system typically includes a number of mirrors and lenses that are arranged in a particular orientation to provide the desired optical performance and reduce the image from the mask and onto the photosensitive substrate, e.g., wafer.

For purpose of illustrating the present invention, the projection optic box and more specifically, the projection optic system includes one or more mirrors 100. The mirrors 100 are conventional mirrors that are used in the system and can be either convex mirrors, concave mirrors or a combination thereof. While the present embodiment is discussed in terms of actuation and movement (positioning) of a mirror, it will be appreciated that this is merely one embodiment and the present invention applies more broadly to the positioning of optic elements, including lenses of a refractive system.

To position the mirrors 100 in the projection optic box, an actuation means is chosen, such as one following the Lorentz principle, for actuation of the mirrors 100 to control the positioning of the mirrors 100 within the projection optic box. To maintain the high quality of the optical surface conditions from a mirror manufacturing point of view were set, furthermore sub-system requirements were derived. The following conditions represent the main driving boundary condition as well as the main sub-system requirements, both functional and manufacturing, with respect to the manufacture and construction of the mirrors 100 within the projection optic box. More specifically, the main driving boundary condition is that it is desirable that there be no mechanical interfaces at a backside or rear face of the mirror 100. Moreover, the main sub-system requirements are that it is desirable that (1) a mechanical stiff connection be provided between the mirror 100 and actuator for accurate positioning; (2) no stick slip should occur due to movement of the mirror 100; (3) decoupling of thermal induced radial forces and moments is provided; (4) decoupling of glue shrink induced forces; and (5) reproducible deformation of the mirror during manufacturing, metrology measurement, and later during operation.

For purpose of illustration only, one exemplary projection optic system includes multiple independently adjustable mirrors 100 that are positioned within the projection optic box. FIG. 1 is a cross-sectional view of one conventional a spherical mirror 100 that is typically used in an optic system for the semiconductor industry and more specifically, is typically found with the mirror module 10 that is used in such optic system. The illustrated mirror 100 includes interface "points" 102 that are positioned and formed at prescribed locations along the surface of the mirror 100. Interface points 102 are regions or points of the mirror 100 that contact other members that placed adjacent thereto. In order to ensure substantially zero deformation of optical surface other than that due to gravity, the mirror is to be supported in a pure kinematic manner (preferably at 3 points) with minimal parasitic forces and moments. The subject of the current invention is meant to achieve such requirements. The precise nature of the contact is described in great detail hereinafter. For example, the mirror 100 can include a number of openings or notches 102 that are formed at the prescribed locations (e.g., three locations substantially equally spaced circumferentially in a neutral (w.r.t. elasticity) plane of the mirror). It will be appreciated that the shape and other illustrated details of the mirror 100 are merely exemplary and for purpose of illustration only, and therefore, the structure of the illustrated embodiment is not limiting in any way.

FIG. 1 is a cross-sectional view of a hanging actuator unit 120 (actuator) with a mirror mount 200 according to a first embodiment being securely coupled thereto. The actuator unit 120 is used in combination with a static force actuator in the optic system to allow the a-spherical mirrors 100 to be positioned in up to six degrees of freedom at a high accuracy and in a high vacuum environment. The interfaces between a base 122 of the actuator unit 120 and the mirror 100 and the static force actuator or other device and the mirror 100 are the mirror mounts 200. In the illustrated embodiment, the base 122 is generally coupled to the mirror 100 by means of a number of pivotable levers 123 that extend between the base 122 and the mount 200 and actuator elements 125 that likewise extend between the base 122 and mount 200. Levers 123 functions to provide a constant force against gravity with zero stiffness, i.e., independent of its length. The mounts 200 act as thermal decoupling interface parts as described herein. The gravitational force on the system and the direction thereof is indicated by the arrow.

In the exemplary first embodiment, the mirror mount 200 consists of one single part that contains all the desired interfaces. One function of the mirror mount 200 is to provide a direct interface to the mirror 100, the second function is to provide an interface to a multiple of actuators 125 and the third function is to provide supporting means for measurement of the optical surface.

Figure 2:
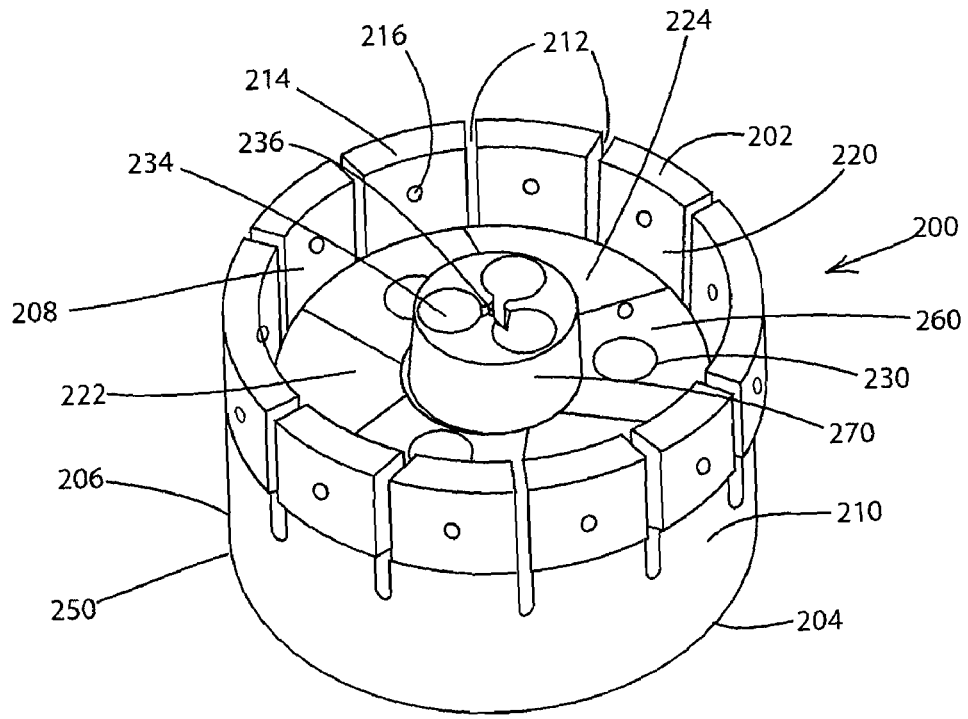
FIG. 2 is a top perspective view of one exemplary mirror mount.
Figure 3:
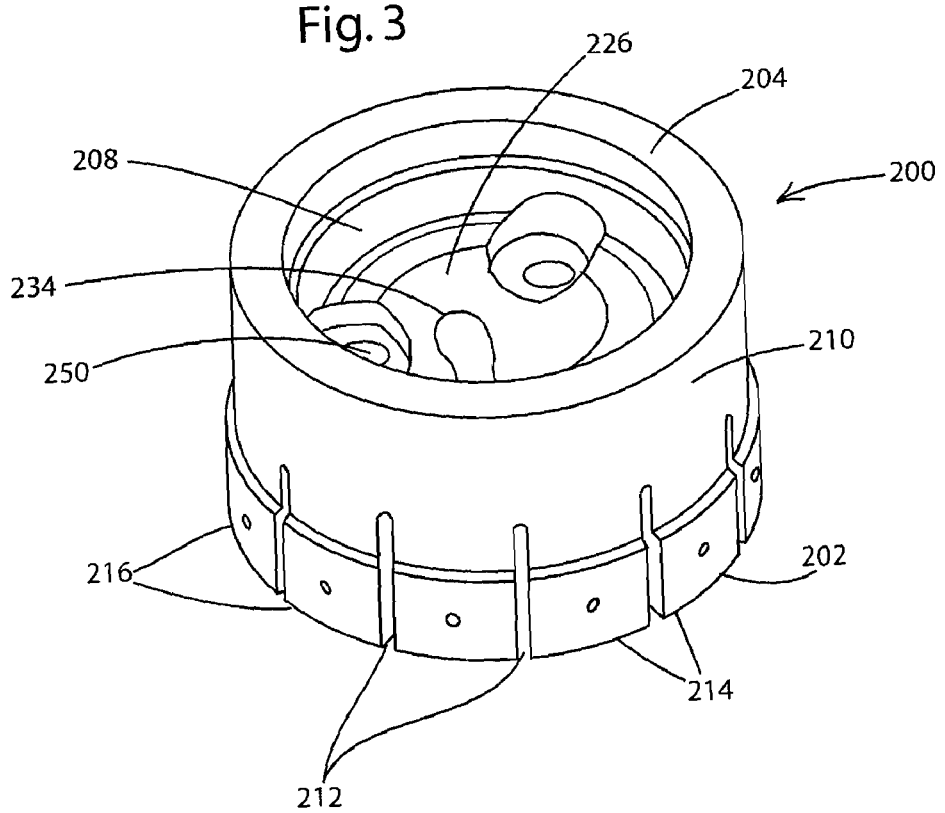
FIG. 3 is a bottom perspective view of the mirror mount of FIG. 2.
Figure 4:
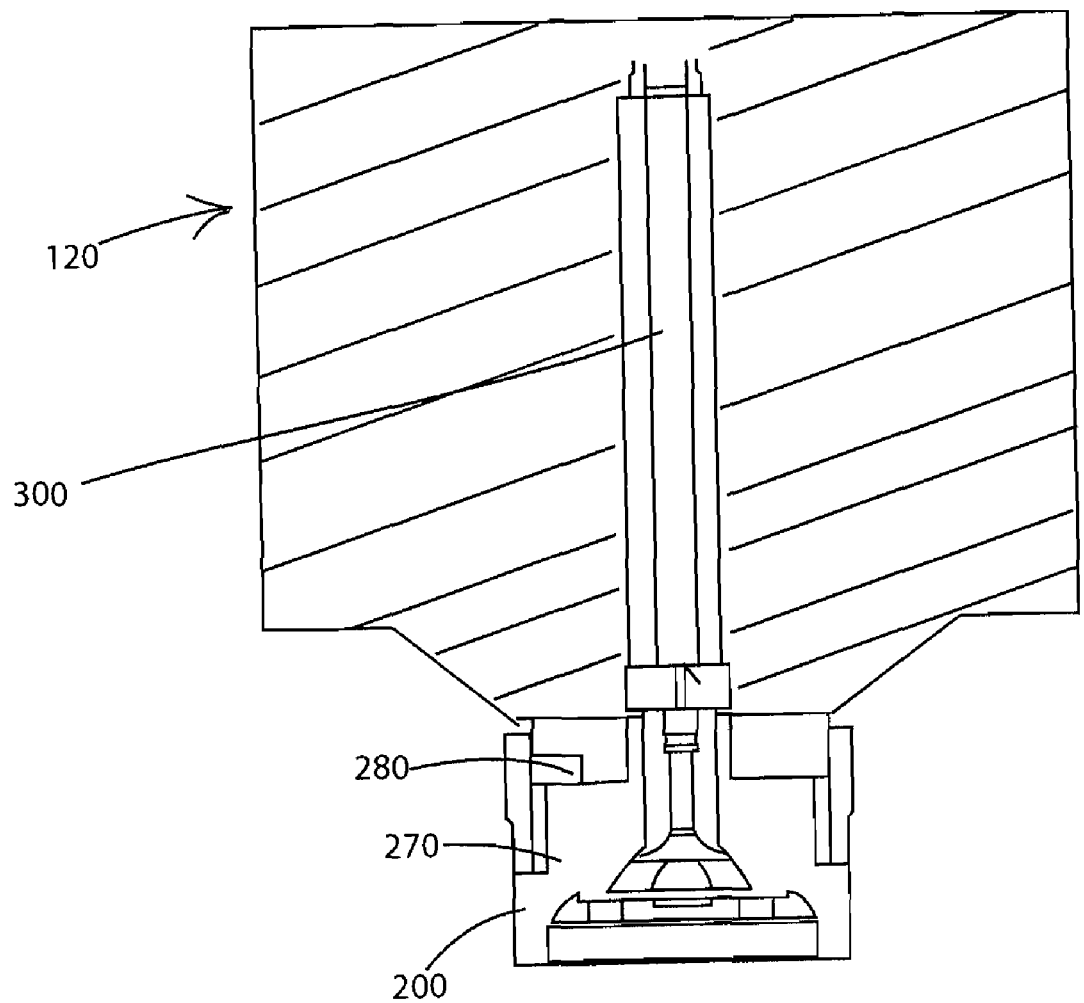
FIG. 4 is a cross-sectional view of the mirror mount being coupled to the hanging actuator unit of FIG. 2.

FIG. 2 is a top perspective view of the mirror mount 200 and FIG. 3 is a bottom perspective view of the mirror mount 200. The exemplary mirror mount 200 is a generally cylindrical member and includes an open first end 202 and an opposing open second end 204. The first end 202 of the mirror mount 200 is the end which is coupled to the actuator 125 (FIG. 2) when the optic system is assembled. The mirror mount 200 has a body 206 with an inner surface 208 and an opposing outer surface 210. At and proximate to the first end 202, the body 206 is constructed so that it is segmented and more specifically, the body 206 has a number of slots 212 formed therein and radially around the body 206. The slots 212 are formed completely through the body 206. The slots 212 are arranged parallel to one another and are open at the first end 202 and extend a predetermined distance to a closed end. Between two slots 212, a segmented body section or flexible element 214 is formed and therefore, the mirror mount 200 has a predetermined number of flexible elements 214 formed therein. By incorporating flexible elements 214 into the body 206, the first end 202 can accommodate coupling with the mirror 100 since the flexible elements 214 can flex or otherwise move when forces are applied thereto. It will be appreciated that the number of flexible elements 214 can vary and can fulfill the design specification requirements so long as the right design parameters are chosen, i.e., width, thickness, length, etc. Each flexible element has a high stiffness in a plane containing the flexible element and a low stiffness out of plane.

In the illustrated embodiment, each flexible element 214 has an injection port or opening 216 formed therethrough. The port 216 is formed between the open second end 204 and the closed end of the slot 212 and in one embodiment, the port 216 is formed in a medial section of the flexible element 214. The size and shape of the port 216 can be varied depending upon the particular application and in one embodiment, the port 216 is a circular opening.

The body 206 is defined by a cylindrical outer wall 220 and further includes an integral annular platform 222 that is formed between the outer cylindrical wall 220. The annular platform 222 does not extend completely to the outer cylindrical wall 220 but rather the annular platform 222 has a diameter that is less than a diameter of the outer cylindrical wall 220, resulting in a space 223 being formed between the outer annular surface of the platform 222 and the outer cylindrical wall 220. The formation of this space 223 permits the flexible elements 214 to have the desired flexing action since the space 223 accommodates inward flexing of the flexible elements 214. The annular platform 222 does not extend completely to the second end 204 but rather terminates at a location prior thereto and a planar floor (ring-shaped surface) 207 extends between the bottom of the annular platform 222 and the outer cylindrical wall 220.

The platform 222 has a first face 224 that faces the first end 202 and the body 206 has an opposing second face 226 that faces the second end 204. The second face 226 is therefore orientated below the platform 222. The platform 222 has a height such that a top surface thereof is located between the two ends of the slot 212 and the platform 222 includes a number of features that are formed as a part thereof to permit coupling between the mirror mount 200 and the other components of the optical system. The first face 224 is a substantially planar surface that is disposed perpendicular to the vertical cylindrical outer wall 220 that forms part of the body 206.

The platform 222 also includes a central hub 230 that is in the form of a protrusion that projects and protrudes therefrom. The central hub 230 is preferably constructed so that it has a height such that a top surface thereof does not extend beyond the first end 202. The exemplary central hub 230 is also an annular member that is formed generally in the center of the platform 222 and is integral thereto. In the illustrated embodiment, an annular channel or groove is formed in the platform 222 around the bottom of the hub 230 where it integrally attaches to the platform 222.

The central hub 230 has a number of through bores or openings 232 formed therethrough such that these features extend from the top surface of the central hub 230 to the opposite second face 226 of the body 206. More specifically, the central hub 230 includes a plurality of first openings 234 formed therethrough and a central retaining space 236 that is formed therethrough. The central retaining space 236 is in selective communication with each of the plurality of first openings 234 via a slot so that an object that is properly placed into one of the first openings 234 can be brought into placement within the central retaining space 236 when the object is orientated in a prescribed position where the interference between the object and the body 206 is removed.

Because the space 236 has an inward taper, an interference surface is provided for the object that is initially received within one of the first openings 234 and then transferred to the lower second section of the central retaining space 236. In other words, any object that is greater in size than the first section of the central retaining space 236 is prevented from moving from the second section to the first section thereof by means of the conically-shaped interference surface once the object is received into the lower second section of the space 236.

It will be understood that communication is provided between each of the first openings 234 and the first section of the central retaining space 236 by means of a number of radial slots formed in the hub body, with each of these slots forming a passageway between the first section of the central retaining space 236 and the upper portions of the first openings 234.

The platform 222 also has a number of other features formed therein to facilitate coupling between the mirror mount 200 and other optical components. For example, a plurality of openings 250 are formed therein between the hub 230 and the outer peripheral vertical wall of the platform 222 and these openings 250 extend completely through the body 206. In other words, the openings 250 are open at each of their ends with one end forming an entrance at the first face 224 and the other end forming an entrance at the second face 226. The openings 250 are concentrically formed relative to the first openings 234 such that the first openings 234 are radially offset from the openings 250. In other words, each opening 250 is formed between two adjacent first openings 234. It will be understood that the openings 250 can have any number of different shapes and sizes and the illustrated circular shaped openings 250 are merely exemplary in nature.

As shown in FIG. 3, the platform 222 has a plurality of raised contact surfaces 260 that have predetermined shapes and areas. Each contact surface 260 is elevated slightly relative to the surrounding top surfaces of the platform 222 and in the exemplary embodiment, the contact surface 260 extends from the outer peripheral edge of the platform 222 to the groove 229 formed adjacent the hub 230. Each contact surface 260 is formed around one opening 250 itself and the length of the outer edge thereof is slightly longer than the length of the inner edge and therefore, its sides have a tapered construction. The contact surfaces 260 provide a mounting surface for securely mounting a component to the mirror mount 200 as will be described in greater detail hereinafter. Thus, at both ends of the openings 250, a planar mounting surface is provided and the first face 224 serves as a contact surface to a member that forms a part of the actuator 120 and is coupled to the mirror mount 200 by way of a plurality of fasteners (not shown) that are received within the openings 250.

Thus, the mirror mount 200 provides an interface to the actuator, which consists of three contact surfaces around the bolts, for a good contact and a small force path between the mirror mount and the actuator. As illustrated in FIG. 2, the first end 202 and the first face 224 face the actuator 120 and therefore, the planar surfaces of the first face 224 that surround the openings 250 serve as contact surfaces to the actuator and provide a stiff and strong connection from the mirror mount 200 to the actuator. The body 206 also includes a locating/positioning opening or through bore 270 formed therethrough from the first face 224 to the second face 226. The bore 270 is formed through one of the contact surfaces 260 and therefore it is proximate to one of the openings 250. The bore 270 receives a pin 280 (e.g., dowel pin) that serves to rotationally position the mirror mount 200 on the actuator. More specifically, the pin 280 extends outwardly from the actuator and in order for the mirror mount 200 to seat properly against and interface with the actuator, the pin 280 is received into the bore 270 otherwise, the mirror mount 200 will not mate with the actuator. The pin 280 thus acts as a locating feature for the proper rotational positioning of the mirror mount 200 on the actuator since the mirror mount 200 can only fit in one position on the actuator (i.e., the position where the pin is received within the bore 270). Once the pin 280 is received within the bore 270, rotation of the mirror mount 200 relative to the actuator is prevented.

The mirror mount 200 can be formed of a number of different materials and in one embodiment, the mirror mount 200 is formed a material where the CTE matches that of the optics and it offers low thermal conductivity.

The mirror mount 200 is securely coupled to the mirror 100 by inserting one mirror mount 200 into one of the openings 102. The opening 102 is therefore of a complementary size and shape to ensure that the mirror mount 200 remains in place within the opening 102 during operation of the optical system (e.g., movement of the mirror 100). While there are a number of ways to ensure that the mirror mount 200 remains securely coupled to the mirror 100, one exemplary technique is to apply an adhesive material, such as an epoxy adhesive the CTE of which is substantially close to that of the optics substrate and/or the mirror mount.

In order to facilitate the application of the adhesive, the previously mentioned injection ports or openings 216 are used as injection points for the adhesive. The adhesive is applied through these ports 216 and it provides a bond between the outer faces of the flexible elements 214 of the mirror mount 200 and the actuator 120 to which the mirror mount 200 is attached to. The outer faces of the flexible elements 214 function as an adhesive interface to the mirror 100 and provide a stiff, strong and stable connection from the mirror 100 to the mirror mount 200, while introducing a minimum of deformation of the mirror surface. To be able to actuate in the neutral plane of the mirror, the mirror mounts 200 are positioned in the openings 102 in the mirror 100 and the adhesive interface of the mirror mount 200 should be at a certain height in the mirror 100 such that the deformation of the optical surface due to external actuation forces is minimal.

The flexible element nature of the mirror mount 200 provides a number of advantages and increases the performance capabilities of the first mechanical interface between the mirror mount 200 and the actuator 120. More specifically, the flexible elements 214 of the mirror mount 200 provide decoupling of thermal induced radial forces as well as decoupling of glue shrink induced radial forces as will be described below.

It will be appreciated that by incorporating flexible elements 214 into the design of the mirror mount 200, a trade off between thermal induced forces and mechanical stiffness is realized. As previously mentioned, it is desirable in constructing the first mechanical interface that the sub-system is marked by a mechanical stiff connection as well as providing a construction that decouples induced thermal radial forces and glue shrink radial forces. Thus, the construction combines a mechanical stiff connection while providing a decoupling of radial forces. A construction without flexible elements 214 would not meet the requirements on SFD or positioning performance due to mediocre dynamics as a result of the construction of the components of the mechanical interface. The incorporation of flexible elements 214 provides the mirror mount 200 with the necessary stiffness while minimizing relaxation deformation and thermal deformation.

According to one embodiment, a coupling member 300 is provided for coupling the mirror mount 200 to a static force actuator, e.g., to compensate for gravity. The force generating mechanism compensates for the mass of the mirror 100 (FIG. 1). The pin 300 has a first end and an opposing second end with a base or intermediate section being formed between the first end and the second end. The pin 300 serves as a decoupling for all moments and forces in all but the z-direction. The pin 300 introduces only very little disturbance forces and moments to the mirror. The pin 300 can be the same as the lever 123 shown in FIG. 1.

While, the pin can be formed of any number of different materials, one exemplary material for forming the pin is a corrosion free spring material. The pin exhibits a degree of resiliency or flexibility to permit the pin to couple the mirror mount 200 to the force generating mechanism. The pin is generally an elongated member that is preferably a single integral part with a first interface at the first end and a second interface at the second end with the intermediate section formed therebetween. The intermediate section is made longer in order to increase the bending stiffness and to increase the axial stiffness of the pin.

The elongated flexible pin 300 has a flexible part at the first end (the top) which serves as the first interface and it has one or more flexible hinges that provide two degrees of freedom at the second end (the bottom) which serve as the second interface. The flexible part has a head that includes a contact surface that constitutes an interface surface for engaging the mirror mount 200 as described hereinafter. The one or more flexible hinges permit the pin to flex and pivot as a result of various movements of the optical system.

It will be appreciated that a cover is provided to prevent against the unlikely occurrence of a "pin" failure. The cover is designed to extend across and cover the second face 226 to prevent undesired movement of the pin in the case of a pin failure. The cover is configured to seat flush against the second face 226. The cover has a body that has a center portion and a plurality of finger portions that are formed radially around the center portion for placement between adjacent bolts.

The finger portions are defined by a plurality of cut-outs that each has a complementary shape as one bolt that is to be received therein when the cover is securely attached to the mirror mount 200. Each finger portion has a peripheral outer edge that has a complementary shape as the vertical outer wall 220 of the mirror mount 200 so that the finger portion seats at or proximate to the vertical outer wall 220. Because the vertical outer wall 220 is annular in shape, the peripheral outer edge has a complementary arcuate shape.

The cover has a plurality of fasteners for securely attaching the cover to the mirror mount 200. The fasteners are disposed on each finger portion near or at the peripheral outer edge so that the fasteners axially align with the openings formed in the annular ring when the cover is laid over the first face 224. In the attached position, the cover receives the bolts through the cut-outs and the center portion covers the first openings and the central retaining opening.

In the highly unlikely occasion of a pin failure, the broken part of the pin could fall down through the entire machine resulting in at least an undesirable condition and likely damage to the machine. The cover is designed to prevent this from happening since the broken pin part, etc. will be caught by the cover. In order to avoid stresses from expansion differences (e.g., thermal expansion), the cover is preferably formed of the same material as is used to make the mirror mount 200.

In yet another aspect, the present mirror mount 200 serves as an interface of the surface of the mirror 100 during production (metrology mount). The mirror mount 200 engages an elongated metrology mount member that is designed to be received into the mirror mount 200 at the second end and within the central retaining space so that the mirror mount 200 is disposed on the mount member to permit certain measurements and other operations to be performed on the mirror mount 200.

Now referring to FIGS. 5-8, another mechanical interface according to an exemplary embodiment is illustrated and is generally indicated at 400. The mechanical interface 400 is a standing type interface constructed to interface with the mirror 100 and permit free movement thereof within the projection optic box. Movement of the mirror 100 (FIG. 1) within the projection optic box causes a displacement between the mirror 100 and the "fixed" world. Introducing an interface that is compliant in certain degrees of freedom will minimize parasitic force and moments causing mirror deformation in the mechanical interface 400. As with the prior embodiment, the mechanical interface 400 is a mirror mount that permits mirrors 100 (e.g., aspherical mirrors) to be positioned in up to six degrees of freedom at a high accuracy and in a high vacuum environment by way of actuators. The mechanical interface between these actuators and the force generating mechanism and the mirrors 100 is the mirror mounts 400.

Figure 5:
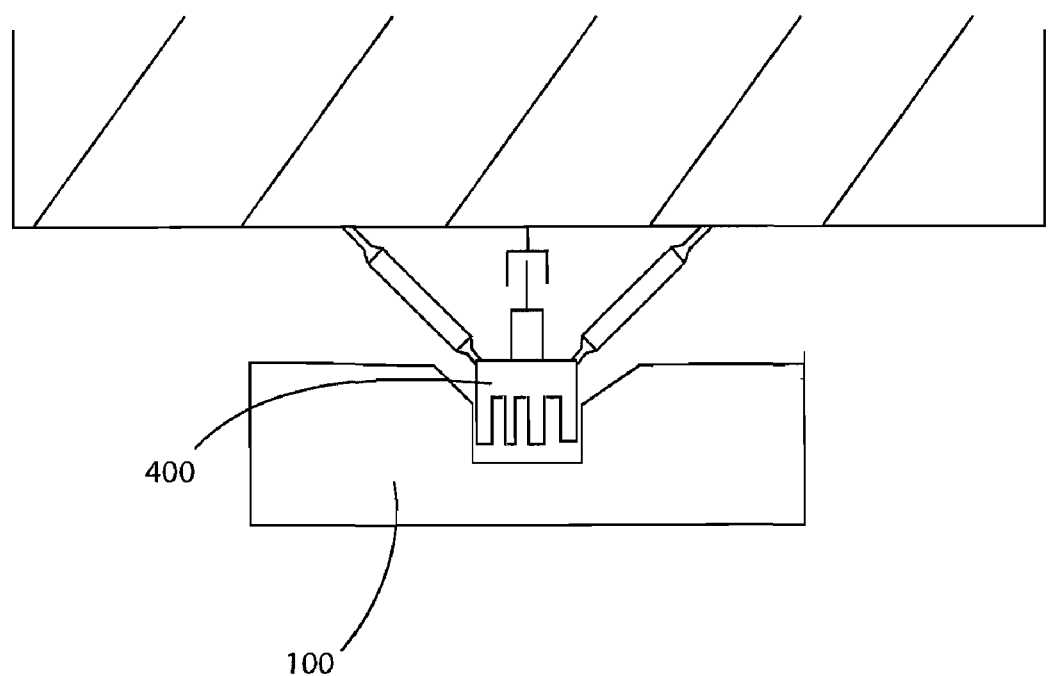
FIG. 5 is cross-sectional view of a mirror assembly in which a plurality of standing actuator units including mirror mounts according to a second embodiment is illustrated.

Unlike the mirror mount 100 of FIG. 2, the mirror mount 400 can be formed of two sub modules. The first sub module is the direct interface to the mirror 100 and the second sub module is the interface for the force generating mechanism. FIG. 5 is a cross-sectional view of an actuator module 500 that has one mirror mount 400 securely attached thereto. As with the previous embodiment, the mirror mount 400 becomes one part with the mirror 100 (FIG. 1) after it is securely attached thereto and according to one exemplary embodiment, each of the five actuated mirrors 100 in the projection optic box 10 has three actuators and three mirror mounts 400 for the positioning thereof.

The exemplary mirror mount 400 includes three major components, namely, a mirror outer bush 410, a mirror inner bush 470 with a bush cover 480 and a plurality of bearing pins 490. The mirror outer bush 410 acts as the first sub module and directly interfaces with the mirror 100 (e.g., a zerodur mirror) and it will be appreciated that other components or parts can be incorporated into in the design of the mirror outer bush 410 for clamping or for other reasons.

The exemplary mirror outer bush 410 is a generally cylindrical hollow member with a body 412 having a first end 414 and an opposing second end 416. The body 412 also includes an outer surface 418 and an inner surface 420. The mirror outer bush 410 has a similar construction and features as the mirror mount 200. For example, at and proximate to the second end 416, the body 412 is constructed so that it is segmented and more specifically, the body 412 has a number of slots formed therein and radially around the body 412. The slots are arranged parallel to one another and are open at the second end 416 and extend a predetermined distance to a closed end. Between two slots, a segmented body section or flexible element 424 is formed and therefore, the mirror outer bush 410 has a predetermined number of flexible elements 424 formed therein. As with the first embodiment, by incorporating flexible elements 424 into the design of the mirror outer bush 410, the mirror outer bush 410 can accommodate coupling with the mirror 100 since the flexible elements 424 can flex or otherwise move when forces are applied thereto.

As with the first embodiment, each flexible element 424 has an injection port or opening formed therethrough. The port is formed between the open second end 416 and the closed end of the slot and in one embodiment, the port is formed in a medial section of the flexible element 424. The size and shape of the port can be varied depending upon the particular application and in one embodiment, the port is a circular opening.

The inner surface 420 of the outer bush body 412 includes an annular lip 419 that protrudes inwardly from the body 412 into interior cavity of the mirror outer bush 410. As will be described in greater detail hereinafter, the lip 419 provides a clamping surface that engages both the bush cover 480 and the mirror inner bush 470. This annular lip 419 is formed at the first end 414 of the body 412.

As with the previous embodiment, the mirror outer bush 410 is preferably made of a material with similar CTE to the mirror. The mirror outer bush 410 is the direct interface to the mirror 100 as the mirror outer bush 410 is inserted into one of the openings 102. An adhesive material, such as filled epoxy, is injected through the ports so that it is dispersed between the outer surface 418 of the mirror outer bush 410 and upon hardening of the adhesive material, a bond is formed between the mirror 100 and the mirror outer bush 410. It will be appreciated that it is also possible to replace the adhesive (glue) joint with ansprengen or cold bonding.

The mirror outer bush 410 is clamped by two parts, namely the mirror inner bush 470 and the bush cover 480 and therefore, the two parts 470, 480 serve as clamping parts that result in the secure attachment between the parts to form a single joined structure. The clamp parts 470, 480 have three interface functions, namely (1) they provide a stiff connection to the mirror outer bush 410; (2) they provide a stiff connection to the actuator interface; and (3) they hold the plurality of bearing pins 490.

The mirror inner bush 470 is constructed and configured so that it acts as a clamping part that exhibits high stiffness. The mirror inner bush 470 has a cylindrical body 471 that is generally hollow in that it has an interior cavity formed therein and it has a first end 473 which is closest to the bush cover 480 and an opposing second end 475 that is positioned adjacent the second end 416 of the mirror outer bush 410 when the two are coupled to each other. The bush cover 480 is spaced slightly from the first end 473 of the mirror inner bush when the clamping action is complete due to the presence of the lip 419 of the mirror outer bush 410 being disposed therebetween. The cylindrical body 471 has an annular shoulder 477 formed at the first end 473 thereof and which is defined by a vertical flange wall 479 (annular shape) and a ring-shaped ledge 481 that extends from the vertical flange wall 479 to an outer peripheral edge of the cylindrical body 471.

The bush cover 480 is a disk shaped member that has a diameter that is greater than the diameter of the vertical flange wall 479 so that the bush cover 480 extends beyond the vertical flange wall 479 and lies over the ring-shaped ledge 481. The bush cover 480 has a beveled annular surface that leads to and terminates at the top face of the bush cover 480 and has an undercut 489 formed in a lower face thereof that receives the top face (first end 414) of the mirror outer bush 410.

The bush cover 480 has a central opening 520 that receives a fastener 522 that is used to fasten the cover 480 to the inner bush 470 with the outer bush 410 being clamped therebetween. As shown in the cross-sectional view of FIG. 8, the fastener 522 seats against a planar contact surface 524 formed around the opening 520. The planar contact surface 524 is recessed within the bush cover 480 so as to permit the fastener 522 to be recessed within the bush cover 480 when it is securely connected to the inner bush 470. This recessed construction saves space when the components are assembled to one another. In the exemplary embodiment, the opening 520 is circular shaped since one exemplary fastener 522 is a bolt.

The bush cover 480 also has a plurality of other openings 530 formed therethrough for assisting in the fastening of the actuator interfaces to the mirror mount 400 (i.e., the inner bush 470). The openings 530 are shaped and sized to permit a predetermined number of fasteners or the like to pass therethrough and into engagement with the inner bush 470 as described below. The exemplary openings 530 are formed radially around the center opening 520 that received the center fastener 522 and as illustrated, the openings 530 along with the recessed platform and center opening 520 generally form a recessed spoke-shaped member.

The openings 530 can have any number of different shapes and they are preferably completely open to the recessed platform along the height of the opening. The illustrated body of the bush cover 480 is formed so that each opening 530 is defined by an arcuate end wall near the peripheral edge of the bush cover 480 and an opposite edge of the opening 530 is spaced close to the center opening 520. Between the arcuate end wall and the entrance into the center section, each opening 530 is defined by a pair of generally planar walls that are formed generally parallel to one another. As shown, the body of the bush cover 480 is constructed so that vertical contact surfaces 532 (slightly arcuate in shape) are formed between the radial openings 530. The number of contact surfaces 532 is therefore equal to the number of radial openings 530. When the center fastener 522 is disposed through the center opening 520, the head thereof preferably seats only against the contact surface of the recessed platform 524 and does not extend into one of the radial openings 530.

The body 471 of the mirror inner bush 470 has a plurality of openings (through bores) formed therein for mounting of the actuator interfaces and the plurality of bearing pins 490. More specifically, a plurality of first mounting openings 472 are formed through the mirror inner bush body 471 for mounting of the actuator interface. The number and relative locations of the first mounting openings 472 is variable as their purpose is to receive fasteners that extend therethrough to couple the mirror mount 400 to the actuator interface. Moreover, when the bush cover 480 is mated with the inner bush 470, the radial openings 530 are axially aligned with the openings 472 to permit the fasteners to be received in the openings 472 resulting in a secure attachment between the actuator interface and the mirror mount 400.

In the illustrated embodiment, the mirror inner bush 470 has three first mounting openings 472 that are formed about 120 degrees apart from one another similar to the radial openings 530 that are formed through the bush cover 480.

As previously mentioned, the mirror outer bush 410 is clamped between the mirror inner bush 470 and the bush cover 480. In other words, the lip 419 of the mirror outer bush 410 is received within the undercut 489 formed in the bush cover 480 and against the annular shoulder 477 so that the lip 419 seats flush against a planar surface of the undercut 489 and the ledge 481. It will be appreciated that the bush cover 480 does not actually seat or contact the inner bush 470 since the lip 419 is disposed therebetween. The center fastener 522 applies a force to the recessed platform 524 in the direction toward the inner bush 470 and thus the fastener 522 serves to clamp the bush cover 480 and the outer bush 410 to the inner bush 470.

The cylindrical body 471 of the mirror inner bush 470 has a plurality of second mounting openings 474 formed therein for mounting the plurality of bearing pins 490 to the mirror inner bush 470. There is at least a number of second mounting openings 474 equal to the number of bearing pins 490 that are used in the mirror mount 400. It will also be appreciated that the second mounting openings 474 are formed in locations where the bearings pins 490 are desired since these openings 474 facilitate the mounting of the bearing pins 490. The openings 474 formed in the outer cylindrical wall are axially aligned with openings that are formed in the boss 479 so that the elongated bearing pin 490 can extend through these openings.

Figure 6:
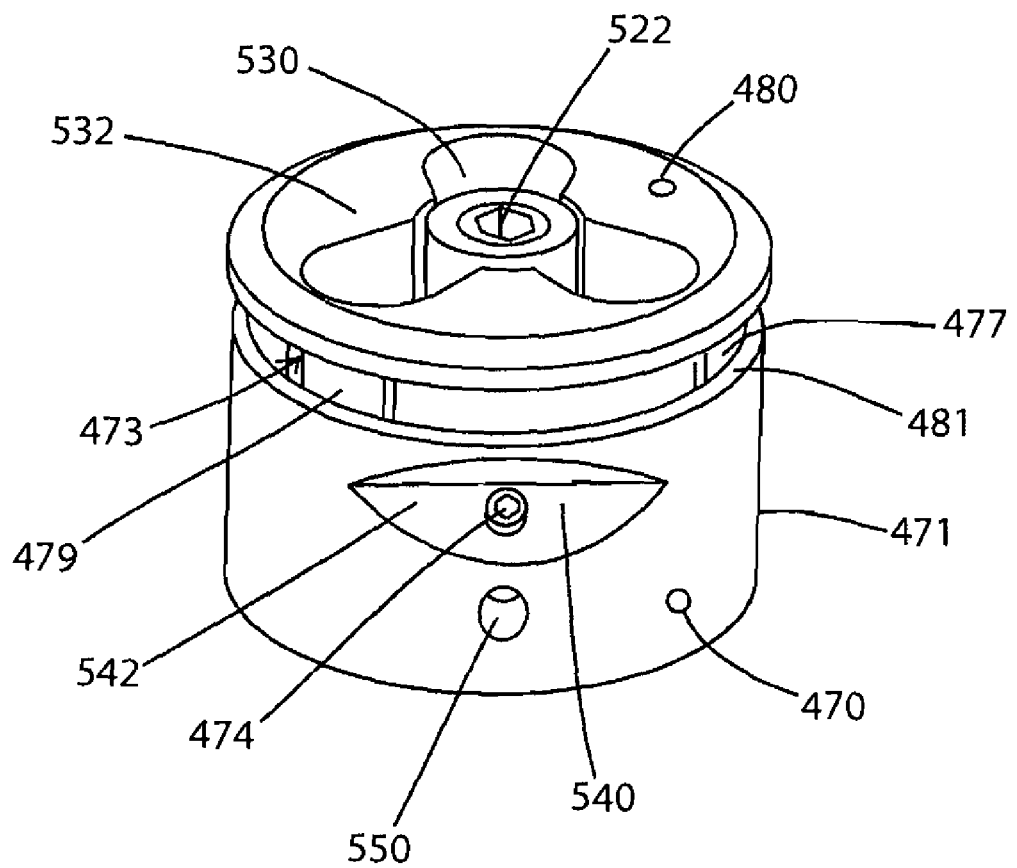
FIG. 6 is a top perspective view of a mirror inner bush and bush cover that form a part of the mirror mount of FIG. 5.

As best shown in FIG. 6, the outer surface of the cylindrical body 471 has a number of wedge shaped cuts 540 formed therein. Each wedge shaped cut 540 is formed of two opposing beveled surfaces 542. One mounting opening 474 is formed through one of the beveled surface 542 (e.g., the lower beveled surface) such that it forms an entrance into the interior cavity of the mirror inner bush 470. The beveled surface 542 serves two functions, first, the beveled surface 542 is perpendicular to the bearing pin 490 so conventional fasteners (screws) can be used to fix the bearing pin 490. Second, because of the beveled surface 542, the head of the screw does not interfere with the outer bush 410.

By inserting the bearing pin 490 into the mounting opening 474 so that a compression fit results therebetween, the bearing pin 490 is positioned within the interior cavity at the desired angle due to the mounting opening 474 being formed on a beveled surface. It will be appreciated that in the illustrated embodiment, there are three wedge shaped cuts 540 due to there being three bearing pins 490. Preferably, an additional aperture 550 is formed in the cylindrical body 471 below one of the mounting openings 474. This aperture 550 is not formed through one of the beveled surfaces 542; however, the aperture 550 can be formed at an angle into the inner cavity of the inner bush 470. The purpose of the aperture 550 is to prevent the bearing pin 490 from rotating while the fastening screw thereof is tightened. In other words, the aperture 550 is formed only for purposes of assembly of the entire mirror mount 400.

It will be appreciated that the mirror mount 400 is formed of two parts (inner and outer bushes) for manufacturing convenience as opposed to being a functional requirement and therefore, it is possible for the mirror mount 400 to be constructed of one part as opposed to two parts. The axes of the bearing pins 490 meet at one point, at or in close proximity to the intersection of the line of action of the actuators and on the mirror neutral plane, are that the end surfaces are at equal distance from this point of intersection.

Figure 7A:
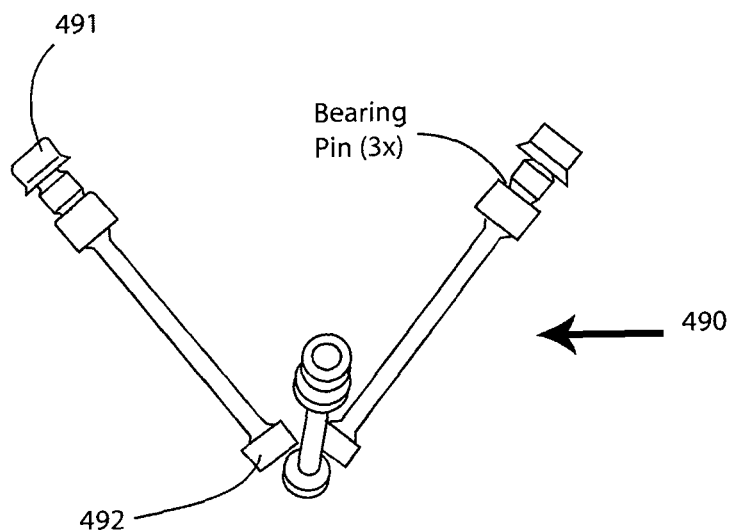
FIG. 7A is a perspective view of a plurality of bearing pins that are operatively coupled inside the inner bush of FIG. 6 according to a predetermined pattern.
Figure 7B:
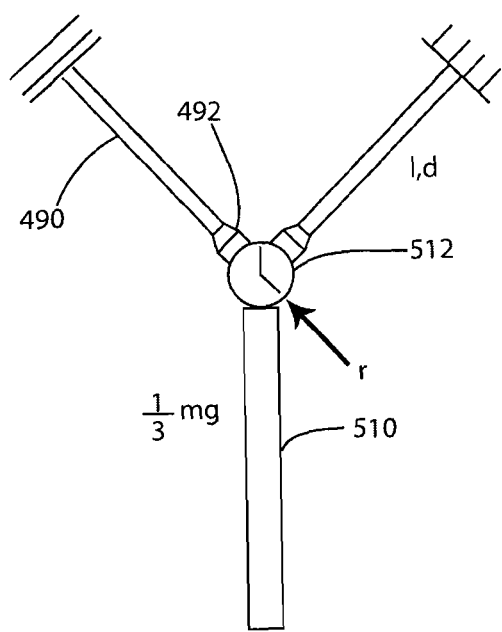
FIG. 7B is a side elevation view of two bearing pins interfacing with a gravity compensator pin.
Figure 8:
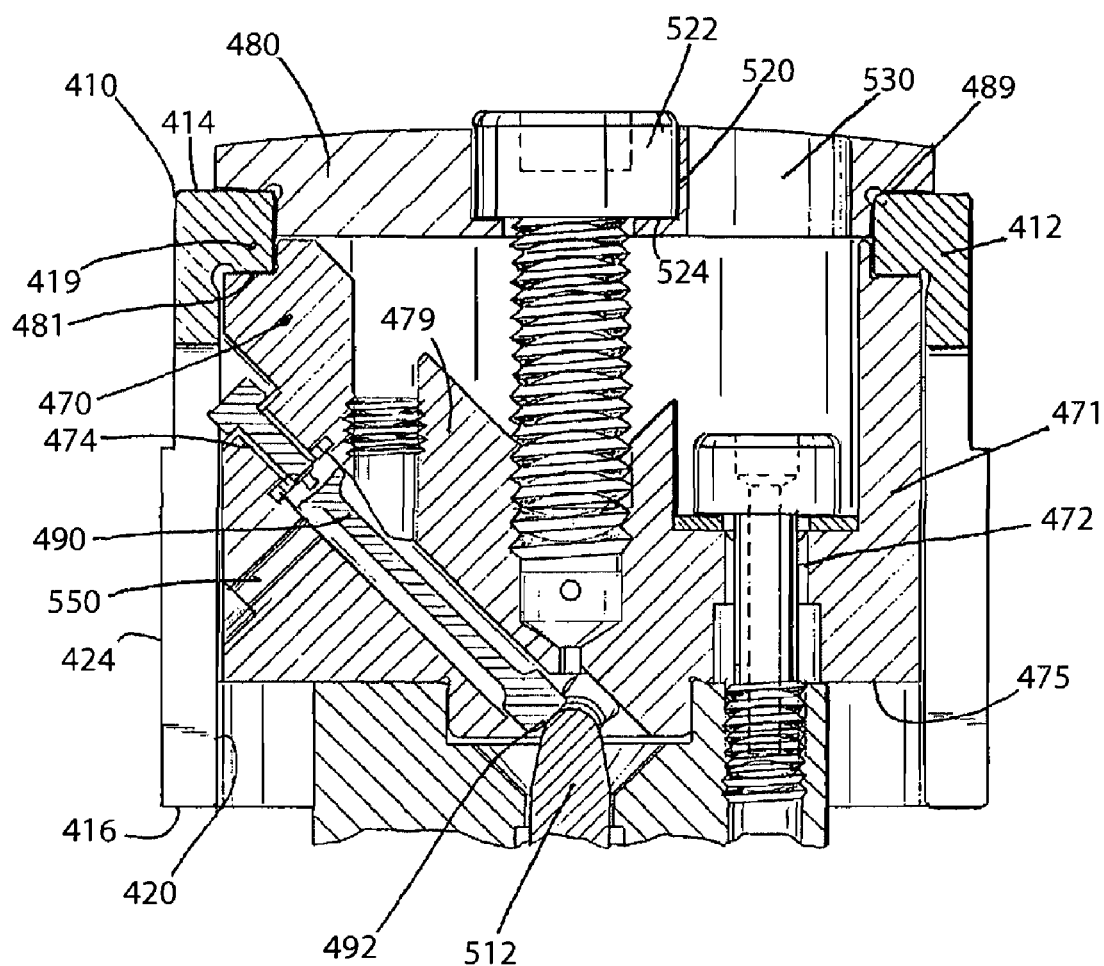
FIG. 8 is a cross-sectional view of the mirror mount of FIG. 6 coupled to an exemplary actuator.

FIGS. 7A-7B best illustrate the exemplary bearing pins 490 that are contained within the mirror inner bush 470. The bearing pin 490 is an elongated structure that has a first end 491 and a second end 492. The first end 491 is the end which is operatively coupled to the mirror inner bush 470, while the second end 492 interfaces with the gravity compensator as will be described in reference to FIG. 17. The bearing pins 490 serve as an elastic ball hinge and the static force actuator interfaces with this hinge with an actuator interface pin 510 (FIG. 7B) that has a ball shaped end 512. It will further be appreciated that during production, this same hinge will serve as an interface for measurement of the optical surface.

The bearing pins 490 are configured and constructed so that they function as an elastic hinge and as shown, the bearing pins 490 act as elongated elastic beams that have equal relative spatial angles to each other when they are properly mounted within the interior cavity of the mirror inner bush 470. The first ends 491 are operatively coupled to the openings 474 and a mounting ring can be used to couple and secure the bearing pins 490 within the interior of the mirror inner bush 470. In one embodiment, the first ends 491 are compressively loaded into the interior of the mirror inner bush 470. The second end 492 is in the form of a head that has a generally circular cross-section; however, the terminal end of the head has a planar or substantially planar surface.

While the use of an elastic ball hinge construction is one preferred configuration, there are a number of other arrangements that can be used to connect the actuator interface pin 510 (or the mirror mount interface). For example, the actuator interface pin 510 can be attached to the mirror mount 400 via a ball joint. It is important not to have two spherical surfaces contacting each other since this involves indefinite positioning of the actuator interface pin 510 in lateral directions inducing moment errors but also undesired hysteresis. During movement of the mirror 100, there is slip between the ball 512 and the surface, resulting in friction forces. The precise nature and magnitude of the friction forces can be hard to predict and it will be appreciated that the resulting friction moment is proportional to the ball radius. To overcome the largest part of the friction in the contacts, ball bearings can be applied to engage and hold the ball shaped end 512 of the actuator interface pin 510. One other construction is that the actuator interface pin 510 can push directly against a flat body connected to the mirror interface in order to avoid friction. Lateral displacement makes the contact sphere (end 512) roll on the contact surface that is connected to the mirror interface. One constraint of this type of construction is the indefinite lateral position and the build-up of undesirable friction forces.

It will be appreciated that one important parameter for the static force actuator interface is not its geometry and accessibility but rather that its location coincides with the line of force of other actuators and that it is at the neutral plane and its ability to allow for small angular misalignment, either by having a ball & socket joint as described or the incorporation of controlled flexibility.

As previously mentioned, the above described mirror mounts overcome the deficiencies of conventional mirror mounts and the present optical arrangement maintains the high quality of the optical surface, reached during polishing of the mirror and desired boundary conditions were set and satisfied by the present optical arrangement. More specifically, the present optical arrangements produce no mechanical interfaces at the back of the mirror side and the mirror mounts provide a mechanical stiff connection; no stick slip should occur due to movement of the mirror; decoupling of thermal induced radial forces; decoupling of glue shrink induced radial forces; and reproducible positioning of the mirror during manufacturing, interferometer, and operation of the actuators.

It will be appreciated that the configuration and construction of the optical system is extremely variable and the actuator units described herein can be mounted in different ways to the mirrors themselves. For example, the arrangement and positioning of the actuator unit relative to the mirror can vary throughout the mirror assembly and from one mirror to the next. For example, one exemplary optical system includes six mirrors and the individual mirrors and actuator units can be different. In one arrangement, mirror 1 (M1) includes a hanging actuator unit which is disposed on the same side of the reflective mirror surface; M2 includes a hanging actuator unit which is disposed on the backside of the reflective mirror surface; M3 includes a hanging actuator unit which is disposed on the same side of the reflective mirror surface; M4 includes a hanging actuator unit which is disposed on the backside of the reflective mirror surface; M5 is preferably a mirror that is not actuated; and M6 includes a standing actuator unit which is disposed on the same side of the reflective mirror surface.

Moreover, it will be appreciated that the line of force of the actuators coincides with hinge center of the static force actuation link (e.g., pin). The common point of actuation lies in mirror neutral plane (a position in the mirror which causes the minimum deformation). The purpose or functional requirement of the mirror bush is to allow transmission of forces in at least 2 degrees of freedom to the mirror (in the present design, in the vertical and tangential directions), while allowing for decoupling of parasitic effects, like thermal expansion, etc. This is achieved by putting a number of flexible elements around 360 degrees (circular or triangular or rectangular), each of which has high-in-plane stiffness and low out-of-plane stiffness. It is desirable that was have all actuation forces acting substantially at one single point per each mirror bush and it is preferred that there are three such points per mirror. It is important that any forces remaining (such as reaction forces to gravity) are repeatable during operation and manufacture, of which using a common supporting geometry is merely one solution but it will be understood that others are possible.

It will be appreciated by persons skilled in the art that the present invention is not limited to the embodiments described thus far with reference to the accompanying drawings; rather the present invention is limited only by the following claims.

What is claimed is:

1. A mirror mount for providing an interface between a mirror and another component, the mirror mount comprising:
   an outer mirror bush having a body including a plurality of flexible elements around a perimeter of the body, each having a high stiffness in plane and a high flexibility out of plane,
   an inner mirror bush having a body including a plurality of first openings formed therein for receiving fasteners for coupling the inner bush to the other component and a plurality of second openings, wherein in an assembled state, the inner bush is received within an interior cavity of the outer bush and is coupled thereto; and
   a plurality of bearing pins coupled to the inner bush within an interior cavity thereof and according to a predetermined arrangement such that longitudinal axes extending the length of the pins meet at one point.

2. The mirror mount of claim 1, wherein the other component is an actuator and the axes of the pins meet at or in close proximity to an intersection of a line of action of the actuators and on a neutral plane of the mirror, wherein end surfaces of the pins are at equal distance from the point of intersection.

3. The mirror mount of claim 1, further comprising:
   a bush cover that is securely attached to the inner bush with the outer bush being clamped therebetween, resulting in the inner bush being fixed within the interior cavity of the outer bush.

4. The mirror mount of claim 3, wherein the bush cover seats against a top surface of the outer bush and includes a recessed section that receives a cover fastener that is securely attached at a distal end to the inner bush.

5. The mirror mount of claim 4, wherein the cover fastener is disposed within the recessed section below a top surface of the cover when the cover is securely attached to the inner bush.

6. The mirror mount of claim 3, wherein the outer bush has an inside lip that is received within a first feature formed in the cover and within a second feature formed in the inner bush to permit the outer bush to be clamped between the cover and inner bush when the cover is securely attached to the inner bush.

7. The minor mount of claim 1, wherein there are three bearing pins that are mounted to an outer wall of the inner bush such that a predetermined relative spatial angle is formed between any two of the bearing pins.

8. The mirror mount of claim 1, wherein the plurality of bearing pins are stiff axially and compliant laterally.

9. The minor mount of claim 1, wherein each bearing pin comprises an elongated elastic member that has a proximal end operatively coupled to the inner bush and an opposite distal end for interfacing with the other component which has a substantially spherical end and applies static force in a substantially axial direction to the minor mount.

10. A minor mount for providing an interface between a minor and a first component, the mirror mount comprising:
  an outer mirror bush having a body including a plurality of flexible elements round a perimeter of the body, each having a high stiffness in plane and a high flexibility out of plane; and
  an inner mirror bush having a body including an interface surface for coupling the inner bush to the first component, wherein in an assembled state, the inner bush is received within an interior cavity of the outer bush and is coupled thereto, the inner bush having a plurality of interface members operatively coupled thereto that provides an elastic interface for receiving and securely holding a coupling portion of a second component that is coupled to the mirror mount, wherein the plurality of interface members are arranged such that longitudinal axes extending along lengths thereof meet at one point and all actuation forces act substantially at one single plane per mount.

11. The mirror mount of claim 10, wherein the outer and inner mirror bushes permit transmission of forces in at least two degrees of freedom to the mirror, while allowing for decoupling of parasitic effects.

12. The mirror mount of claim 11, wherein the at least two degrees of freedom comprise a vertical and tangential direction.

13. The mirror mount of claim 11, wherein the parasitic effects include thermal expansion.

14. The mirror mount of claim 10, wherein the common point of actuation lies in a neutral plane of the mirror.

15. The mirror mount of claim 10, wherein the first component is an actuator and the plurality of interface members comprises bearing pins, the axes of the pins meeting at or being in close proximity to an intersection of a line of action of the actuators and on a neutral plane of the mirror, wherein end surfaces of the pins are at equal distance from the point of intersection.

16. The mirror mount of claim 15, wherein the outer vertical wall includes a plurality of second openings formed therein and according to a predetermined angle, each second opening being aligned with a complementary, aligned second opening formed in the inner bush and terminating in a first interface space formed in the inner bush, the bearing pins extending through the second opening such that the distal ends are disposed in the first interface space.

17. The mirror mount of claim 10, further comprising:
  a bush cover that is securely coupled to the inner bush, with a portion of the outer bush being clamped and fixed between the cover and the inner bush.

* * * * *